United States Patent [19]

Abowitz

[11] Patent Number: 4,678,680
[45] Date of Patent: Jul. 7, 1987

[54] CORROSION RESISTANT APERTURE PLATE FOR INK JET PRINTERS

[75] Inventor: Gerald Abowitz, Rochester, N.Y.

[73] Assignee: Xerox Corporation, Stamford, Conn.

[21] Appl. No.: 831,212

[22] Filed: Feb. 20, 1986

[51] Int. Cl.⁴ .............................................. B05D 3/06
[52] U.S. Cl. .......................................... 427/38; 204/6; 427/234; 427/239; 427/328; 430/308; 430/320
[58] Field of Search ...................... 204/6; 427/38, 234, 427/239, 328; 430/308, 320

[56] References Cited
U.S. PATENT DOCUMENTS
4,184,925 1/1980 Kenworthy ............................ 204/11

OTHER PUBLICATIONS
"Ion Beam Implantation"; N. Basta; *High Technology*, Feb. 1985; p. 58.

Primary Examiner—Bernard D. Pianalto
Attorney, Agent, or Firm—Robert A. Chittum

[57] ABSTRACT

An aperture plate for an ink jet printer of the continuous stream type is made corrosion resistant to the ink for long printer operating times. The aperture plate is made corrosion resistant by ion implantation, preferably of chromium ions by an ion beam implanting device. The walls of the aperture plate nozzles are substantially uniformly implanted by rotating and concurrently angling the aperture plate relative to the ion beam direction. The ion beam density and ion potential are regulated to predetermined ranges to assure effective corrosion protection while preventing overheating which will warp or embrittle the aperture plate.

5 Claims, 5 Drawing Figures

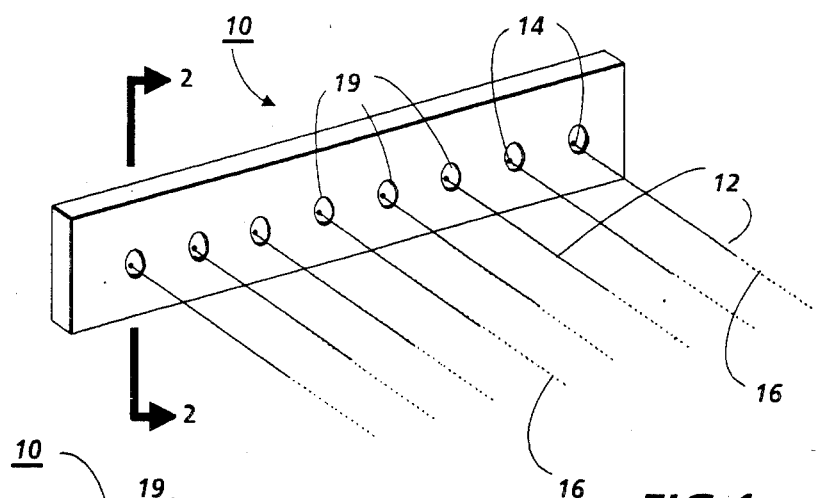
FIG.1
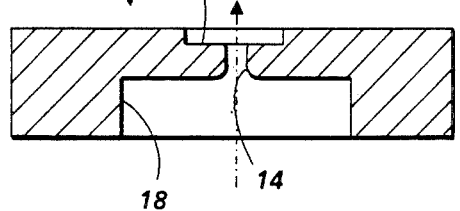
FIG.2
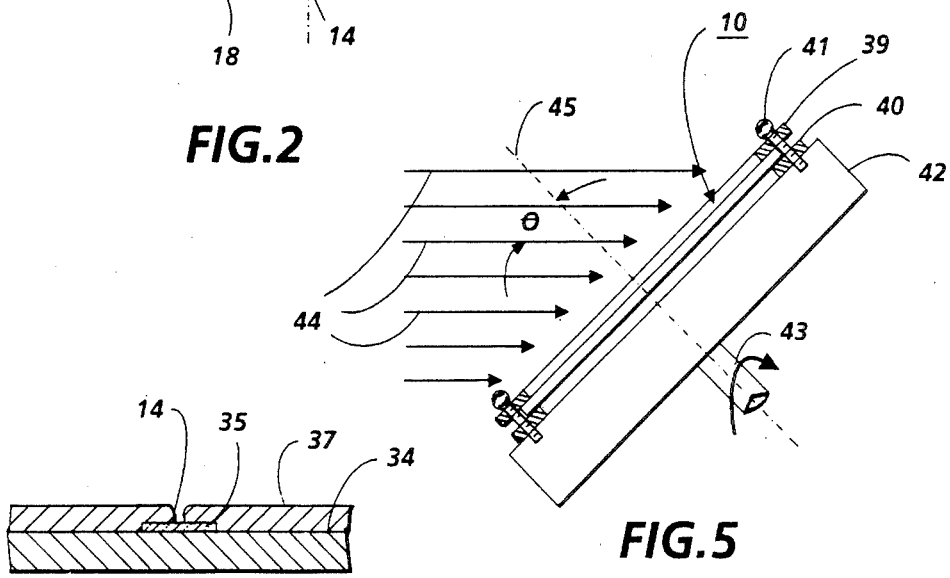
FIG.5
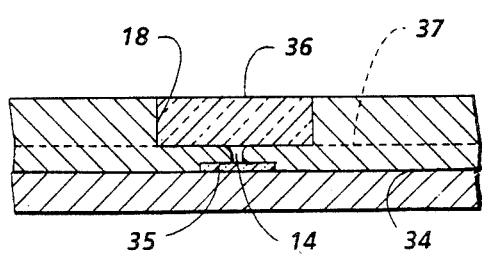
FIG.3
FIG.4

CORROSION RESISTANT APERTURE PLATE FOR INK JET PRINTERS

BACKGROUND OF THE INVENTION

This invention relates generally to continuous stream type ink jet printers and more particularly to the aperture or nozzle plates of an ink jet printhead for such printers.

Generally, in ink jet devices employing a printhead having multiple nozzles from which continuous streams of ink droplets are emitted and directed to a recording medium or a collecting gutter, there are at least one row of nozzles or orifices in an aperture plate which receives an electrically conductive recording fluid, hereinafter called ink, from a pressurized supply reservoir. For an example of a continuous stream type ink jet printer, refer to U.S. Pat. No. 4,395,716 to Crean et al, assigned to the assignee of the present invention.

The ink may be, for example, a water-based fluid and is ejected through the nozzles in a row of parallel streams or filaments. The ink is stimulated prior to or during its exiting from the nozzles so that the stream breaks up into a series of uniform droplets at a fixed distance from the nozzles. As the droplets are formed, they are selectively charged by the application of charging voltages to charging electrodes positioned adjacent the streams at the location where they break up into droplets. The droplets which are charged are deflected by an electrical field either into a gutter for ink collection and reuse, or to a specific location on a recording medium, such as paper, which may be continuously transported at a relatively high speed across the paths of the droplets.

Printing information is transferred to the droplets through charging by the charging electrodes. The charging control voltages are applied to the charging electrodes at the same frequency as that which the droplets are generated. This permits each droplet to be individually charged so that it may be positioned at a distinct location different from all other droplets or sent to the gutter. Printing information cannot be transferred to the droplets properly unless each charging electrode is activated in phase with the droplet formation at the associated ink stream. Failure to do this results in partially charged droplets which may miss the gutter or deposit the droplet at erroneous positions on the recording medium.

It is therefore apparent that ink jet printers of the continuous stream type described above cannot be operated at their maximum capability unless the streams all have the same diameter, velocity, and rheological characteristics. All streams that have the same breakoff length will generate droplets in synchronism at the same distance from their respective nozzles. Thus, stream length, diameter, or direction variation will cause defective or reduced quality printing on the recording medium.

Current practice for the fabrication of aperture plates for continuous stream type ink jet technology is based on the electroforming of nickel using photolithographic processes, such as, for example, that disclosed in U.S. Pat. No. 4,184,925 to Kenworthy. Unfortunately, aperture plates fabricated by such processes show significant corrosion when used with the ink and often after short usage times. It is imperative that aperture plates for commercial ink jet printers be corrosion free over long periods of time, preferably in excess of one year's use.

In an article entitled "Ion-Beam Implantation" by N. Basta, *High Technology*, February 1985, p. 58, it is reported that corrosion has been reduced in ink-spraying nozzles by using a chromium implant. However, such implants per se are insufficient to provide usable aperture plates. A need thus remains for a commercially acceptable aperture plate which is corrosion resistant over a long operating period and for a process to fabricate such a corrosion resistant aperture plate.

SUMMARY OF THE INVENTION

It is an object of the present invention to provide a corrosion resistant aperture plate for a continuous stream type ink jet printer by modification of the surface regions of the electroformed nickel aperture plates, such that the surface modified layer has excellent adhesion to the underlying nickel, and the modifying process is able to coat very small apertures formed in the aperture plate uniformly, while maintaining the high precision of the nozzle area uniformity.

It is another object of this invention to satisfy the critical corrosion protecting criteria noted above by ion implantation.

In the present invention, a beam of a chosen ion is accelerated in a linear accelerator type of machine and aimed at the aperture plate. To control the uniformity of implantation and the temperature of the aperture plate, various techniques are disclosed such as rastering the beam, rotating the aperture plate, angling the aperture plate relative to the beam, etc. The energy of the beam is adjusted to provide the depth of penetration desired and the total ion current is controlled to achieve a desired concentration of implanted ions in the surface region. In the preferred embodiment chromium ions are used for corrosion resistance, though other species of ions may be implanted. It is also possible to implant more than one species of ion to achieve further corrosion resistance or to achieve multiple improvements such as the combination of wear and corrosion resistance simultaneously.

BRIEF DESCRIPTION OF THE DRAWINGS

FIG. 1 shows a aperture plate fabricated according to the present invention;

FIG. 2 is a cross-sectional view through one of the nozzles taken along the line 2—2 in FIG. 1;

FIG. 3 is a cross-sectional view through the nozzle of FIG. 2 taken after the electroforming of the first layer of the aperture whereat the nozzles are produced;

FIG. 4 is a cross-sectional view through the nozzle of FIG. 2 taken after the aperture plate has been completely produced but before removal from the mandrel and before removing the photoresist masks; and FIG. 5 is a partial cross-sectional view showing an aperture plate rotatably mounted at an angle to the ion flow of an ion implanting device.

While the present invention will be described hereinafter in connection with preferred embodiments thereof, it will be understood that it is not intended to limit the invention to those embodiments. On the contrary, it is intended to cover all alternatives, modifications, and equivalents as may be included within the spirit and scope of invention as defined by the appended claims.

DESCRIPTION OF THE PREFERRED EMBODIMENT

In FIG. 1, an aperture plate 10, the subject matter of the present invention, is shown with streams 12 of pressurized ink flowing through nozzles 14 thereof. The aperture plate is one of the essential components of a continuous stream type ink jet printhead. Such a printhead basically comprises a housing with a cavity therein which serves as an ink reservoir or manifold for holding a quantity of pressurized ink, an aperture plate in communication with the housing cavity having nozzles therein through which the ink streams flow, and a means for stimulating the ink in the housing cavity, such as by a piezoelectric driver attached to the housing, so that the ink streams break up into droplets 16 a fixed distance from their respective nozzles.

In page width printing configuration, the printhead's aperture plate has one row of nozzles which extends substantially across the width of the recording medium. The printhead is held stationary and the recording medium is continually moved therepast during the printing operation. The row of nozzles is substantially perpendicular to the direction of movement of the recording medium. In the preferred embodiment, the aperture plate is electroformed nickel that is treated, in a manner discussed more fully later, to render it corrosion resistant to the ink and then it is bonded to the printhead housing. Each aperture plate in the preferred embodiment has 116 nozzles, with each nozzle having a diameter of about 25 microns and is about four mils or 0.1 mm thick. The nozzle spacing is about 107 mils or 2.7 mm center-to-center. Only eight nozzles are shown in FIG. 1 instead of the actual number for sake of simplicity of drawing and easier understanding. Since the present invention concerns only the aperture plate, the details of the remainder of the printhead are not discussed herein. For a description thereof, as well as a continuous stream type ink jet printing system, reference may be made to the above-mentioned U.S. Pat. No. 4,395,716.

FIG. 2 is an enlarged cross-sectional view of the nozzle plate of FIG. 1 taken along a line 2—2 thereof. This is the shape each of the nozzles in the aperture plate 10 made in accordance with a photolithographic process such as that described in U.S. Pat. No. 4,184,925 for electroforming bare nickel plates. Thus, each aperture plate has a series of nozzles 14, and each nozzle has a respective, shallow recess 19. As is well known in the art during the electroplating process, the nickel material 37 used for the aperture plate 10 is formed on the areas of a mandrel substrate 34 which are conductive, thus no nickel material plates onto the photolithographically formed pegs 35 that locate the nozzles. Refer to FIG. 3. The pegs are formed of a thin photoresist material about 75 microns in diameter, 0.15 microns thick, and 107 mils or 2.7 mm center-to-center and are thus readily removed later. As the nickel plate reaches and plates above the tops of the peg, the plating begins to creep inwardly across the top edges of the pegs since the nickel around the edges of the pegs is conductive inducing plating in the radial direction across the tops of the pegs as well as in te outward direction from the substrate. The plating is continued until the openings over the pegs 35 have been closed by the nickel material 37 to the exact diameter for the nozzles 14 in the aperture plate 10, which in the preferred embodiment is about 25 microns.

A second photolithographic process is performed after the first electroforming operation, shown in FIG. 3, while the first electroformed layer 37 is still on the mandrel surface 34. Referring to FIG. 4, larger pegs 36 of photoresist are formed and aligned on the first nickel layer 37 so that they are centered on the nozzles 14. These larger pegs are formed from a thick film photoresist, such as Riston ®, and are about 10 mils or 0.25 mm in diameter and 75 microns thick. A second electroforming operation is carried out to form a thicker nickel layer 38 and recess 18. Next the photoresist pegs 35, 36 and the mandrel substrate 34 are removed leaving the aperture plate 10 as shown in cross section in FIG. 2.

Unfortunately, such bare nickel aperture plates are susceptible to corrosion by the aqueous inks thereby changing the stream directions and stream diameters. To maintain the critical dimensions of the nozzles in the aperture plate any corrosion protection scheme must maintain the nozzle area uniformity, have excellent adhesion to the nickel material of the aperture plate, and have the ability to coat the very small nozzles of the aperture plate. The present invention of subjecting the bare electroformed nickel nozzle plate to ion implantation may dramatically reduce corrosion of the aperture plate during use and satisfy all of the critical criteria required for protecting such plates, provided a substantially uniform ion layer having predetermined ranges of ion density and ion potential are implanted to a predetermined thickness. In this approach, a beam of a chosen ion is accelerated in a linear accelerator type of machine, well known in the art, and aimed at the aperture plate. As shown in FIG. 5, the uniformity of the implantation and the temperature of the nozzle plate is controlled by various techniques such as rastering the beam (not shown) or, in the preferred embodiment, rotating one or more aperture plates 10 held between frame members 39, 40, which are in turn removably mounted on a table 42 by, for example, bolts 41. The table 42 is attached to one end of a rotatable shaft 43, the other end (not shown) of which is pivotally adjustable, so that it may be angled relative to the ion beam direction depicted by arrows 44 as indicated by angle $\theta$ between the shaft centerline 45 and ion beam direction arrows 44. Energy of the beam can be varied from typically 30 to 120 kilo-electron volts (KEV) depending upon the ion and the depth of penetration desired. In the preferred embodiment, an average penetration is about 10 angstrom per KEV, so that a 30-50 KEV beam implants in the range of 300-500 angstrom. A lower energy beam reduces the corrosion resistant effectiveness, and a higher energy beam overheats the aperture plate, causing warpage and embrittlement of the aperture plate. There is actually a quasi-gaussian distribution function and the exact depths depend upon the specific ion chosen and the target material. This technique is not dependent upon thermodynamic solubility of the ion in the host lattice and importantly, more than one species of ion can be implanted to achieve independent properties. In the preferred embodiment the ion chosen is chromium, and the ion density is $1-2 \times 10^{17}$ ions/cm$^2$. Adhesion is excellent because the implanted chromium ions are driven into the nickel lattice. One is actually creating a compositionally graded surface layer rather than having a step function change in composition as in the case of vacuum deposited or electroplated films. Of great importance is the fact that the ion implantation does not alter the dimensions of the nozzles, and no corrections or adjustments in the basic process technology for fabricating the nozzle plates are required. The ion implantation of the nozzle walls is not a problem because the nozzle plate is angularly repositioned relative to the beam. Also, the ion beam is not well collimated so that there is significant intra-beam ion scattering.

After one side of the aperture plate has its surface implanted with cromium ions, the frame members 39, 40 are removed from the table 42, inverted, and reattached so that the other side of the aperture plate is implanted. Concurrently, the nozzle walls are thoroughly protected for they are implanted at angle θ, generally between 30-45 degrees, from both sides.

Another important factor in achieving a substantially uniform implantation of ions is that the surface of the aperture plate be maintained as clean as possible. Complete removal of the photoresist pegs is essential. Any particle of contamination will block the ions and prevent corrosion protection in this area. Since even dust particles are a problem, the aperture plate surface should be maintained in a cleanliness environment of a class II clean room at least until the ion implantation has been completed.

Although the foregoing illustrates the preferred embodiment of the present invention, other variations are possible. All such variations as would be obvious to one skilled in this art are intended to be included within the scope of the invention as defined by the following claims.

I claim:

1. A method of producing a corrosion resistant aperture plate having a plurality of nozzles through opposing surfaces thereof which provide passageways therethrough having internal surfaces, such an aperture plate being suitable for use in a continuous stream type ink jet printer, said method comprising the steps of:
   (a) cleaning the aperture plate in a clean room, and maintaining the cleanliness of the aperture plate until the method is complete;
   (b) uniformly subjecting one of the surfaces of the aperture plate and some portions of the surfaces of its nozzles to an ion bombardment having an energy level of 30-50 KEV to cause at least some of said ions to penetrate at least a portion of the aperture plate and nozzle surfaces to a predetermined depth and with a predetermined density without causing embrittlement or warpage thereof through overheating, said ions becoming implanted among the molecular lattice structure of the aperture plate material, so that the corrosion protecting ion do not change the area dimension of the nozzles;
   (c) rotating said one surface of the aperture plate at an angle relative to the direction of ion flow during step (b), in order to enable ion implantation substantially uniformly along at least a portion of the nozzle surfaces, as well as the surface of the aperture plate which confronts and receives the ions;
   (d) inverting the aperture plate to enable the other surface thereof to confront the ion flow; and
   (e) repeating step (c) so that both surfaces of the aperture plate and the entire surface of each nozzle is substantially uniformly implanted by the ions of said ion beam generating device.

2. The method of claim 1, wherein the aperture plate material is nickel, and wherein the corrosion protecting ion is chromium.

3. The method of claim 2, wherein the ion implantation depth is about 300-500 angstrom and the implanted ion density is $1-2 \times 10^{17}$ ions/cm$^2$.

4. A method of producing a corrosion resistant, elongated aperture plate for a continuous stream type, page width ink jet printer, the aperture plate having opposing ends and surfaces, comprising the steps of:
   (a) photolithographically producing a first linear array of relatively thin, electrically non-conductive pegs on an electrically conductive mandrel;
   (b) electroforming a first stage of the aperture plate on the mandrel by stopping the electroforming process as soon as a predetermined diameter is reached at each peg;
   (c) photolithographically producing a second linear array of electrically non-conductive pegs concentrically arranged over the first array of pegs, the second array of pegs having a larger diameter and thickness than said first array;
   (d) electroforming a final stage of the aperture plate over the first stage to achieve a thickness of the aperture final stage equal to the thickness of the second array of pegs;
   (e) removing the aperture plate from the mandrel and removing both arrays of pegs so that the aperture plate contains a plurality of opposing recesses in opposite surfaces thereof with a passageway through each pair of the opposing recesses, each passageway serving as an ink emitting nozzle;
   (f) cleaning the aperture plate in a clean room;
   (g) mounting the aperture plate ends between two pre-cleaned frame members in a clean room, each frame member having an opening therein so that opposing surfaces and all of the nozzles are exposed;
   (h) mounting the frame member with the aperture plate within an ion beam generating device, while concurrently maintaining the cleanliness of the aperture plate;
   (i) rotating and angling one exposed surface of the aperture plate relative to the direction of ion flow in order to enable uniform ion implantation of one of the pair of recesses and along at least a portion of the nozzle surfaces, as well as the aperture plate surface confronting the ion flow;
   (j) inverting the two frame members holding the aperture plate and repeating step (h), while concurrently maintaining the cleanliness of the aperture plate;
   (k) repeating step (i), so that both surfaces of the aperture plate, both pairs of recesses, and the entire surface of each of the nozzles is substantially uniformly implanted by the ions of said ion beam generating device, thereby providing a corrosion resistant aperture plate suitable for long term use in an ink jet printing environment.

5. The method of claim 4, wherein the aperture plate is nickel; wherein the corrosion protecting ion is chromium; and wherein the ion energy level is 30-50 KEV, the implantation depth is 300-500 angstrom, and the implanted ion density is $1-2 \times 10^{17}$ ions/cm$^2$.

* * * * *